United States Patent
Chen et al.

(10) Patent No.: US 9,385,000 B2
(45) Date of Patent: Jul. 5, 2016

(54) METHOD OF PERFORMING ETCHING PROCESS

(71) Applicant: UNITED MICROELECTRONICS CORP., Hsin-Chu (TW)

(72) Inventors: Chieh-Te Chen, Kaohsiung (TW); Feng-Yi Chang, Tainan (TW); Hsuan-Hsu Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 44 days.

(21) Appl. No.: 14/162,755

(22) Filed: Jan. 24, 2014

(65) Prior Publication Data

US 2015/0214068 A1    Jul. 30, 2015

(51) Int. Cl.
| | |
|---|---|
| H01L 21/00 | (2006.01) |
| H01L 21/311 | (2006.01) |
| H01L 21/027 | (2006.01) |
| H01L 21/768 | (2006.01) |

(52) U.S. Cl.
CPC ...... *H01L 21/31144* (2013.01); *H01L 21/0276* (2013.01); *H01L 21/31133* (2013.01); *H01L 21/76816* (2013.01)

(58) Field of Classification Search
CPC ..... G03F 7/0041; G03F 7/095; G03F 7/0035; G03F 7/091; G03F 7/094; G03F 7/422; H01L 21/0274; H01L 21/0276; H01L 21/31138; H01L 21/31144; H01L 29/02; H01L 21/31133; H01L 21/76835; H01L 21/76832; H01L 21/76807; H01L 21/76813; H01L 21/76811; H01L 21/31116; H01L 21/76826; H01L 21/76877; H01L 2924/00; H01L 23/5329; H01L 23/53293; H01L 53/5226

See application file for complete search history.

(56) References Cited

U.S. PATENT DOCUMENTS

| | | | | |
|---|---|---|---|---|
| 4,338,000 A | * | 7/1982 | Kamimori | B32B 17/10036 252/600 |
| 4,654,315 A | * | 3/1987 | Hsieh | C04B 35/584 501/152 |
| 5,632,910 A | * | 5/1997 | Nagayama | H01L 29/66098 216/47 |
| 6,063,711 A | | 5/2000 | Chao | |
| 6,140,167 A | * | 10/2000 | Gardner | H01L 21/28079 257/E21.202 |
| 6,265,780 B1 | * | 7/2001 | Yew et al. | 257/759 |
| 6,312,874 B1 | * | 11/2001 | Chan | H01L 21/31116 257/E21.035 |
| 6,337,519 B1 | * | 1/2002 | Watatani | H01L 21/02126 257/759 |
| 6,340,632 B1 | * | 1/2002 | Fukada | H01L 21/76804 257/E21.578 |
| 6,368,979 B1 | * | 4/2002 | Wang | H01L 21/76813 216/79 |
| 6,592,776 B1 | * | 7/2003 | Wang | C09G 1/02 252/79.1 |

(Continued)

*Primary Examiner* — Bac Au
*Assistant Examiner* — Sophia Nguyen
(74) *Attorney, Agent, or Firm* — Winston Hsu; Scott Margo

(57) ABSTRACT

A method of performing an etching process is provided. A substrate is provided, wherein a first region and a second region are defined on the substrate, and an overlapping region of the first region and the second region is defined as a third region. A tri-layer structure comprising an organic layer, a bottom anti-reflection coating (BARC), and a photoresist layer is formed on the substrate. The photoresist layer and the BARC in the second region are removed. An etching process is performed to remove the organic layer in the second region by using the BARC and/or the photoresist layer as a mask, wherein the etching process uses an etchant comprises $CO_2$.

10 Claims, 10 Drawing Sheets

(56) References Cited

U.S. PATENT DOCUMENTS

| | | | |
|---|---|---|---|
| 6,605,545 B2* | 8/2003 | Wang | 438/717 |
| 6,690,052 B2* | 2/2004 | Park | H01L 21/31604 |
| | | | 257/296 |
| 6,720,256 B1* | 4/2004 | Wu et al. | 438/638 |
| 7,157,366 B2* | 1/2007 | Kim | H01L 21/76813 |
| | | | 257/E21.579 |
| 8,119,531 B1* | 2/2012 | Arnold et al. | 438/702 |
| 8,987,133 B2* | 3/2015 | Nguyen | H01L 21/02244 |
| | | | 438/637 |
| 9,196,524 B2* | 11/2015 | Chen | H01L 21/31144 |
| 2002/0106898 A1* | 8/2002 | Tsai | 438/691 |
| 2002/0197935 A1* | 12/2002 | Mueller | C09G 1/02 |
| | | | 451/36 |
| 2003/0064604 A1* | 4/2003 | Umeda | H01L 21/31691 |
| | | | 438/745 |
| 2003/0119305 A1* | 6/2003 | Huang | H01L 21/76811 |
| | | | 438/633 |
| 2003/0224571 A1* | 12/2003 | Iijima | H01L 28/90 |
| | | | 438/253 |
| 2004/0009676 A1* | 1/2004 | Kim | C23C 16/401 |
| | | | 438/778 |
| 2004/0045811 A1* | 3/2004 | Wang | C23C 14/221 |
| | | | 204/192.12 |
| 2005/0016585 A1* | 1/2005 | Munzer | 136/261 |
| 2005/0287816 A1* | 12/2005 | Blalock et al. | 438/758 |
| 2006/0072439 A1* | 4/2006 | Kitaura | G11B 7/24038 |
| | | | 369/275.1 |
| 2006/0281325 A1* | 12/2006 | Chou et al. | 438/734 |
| 2007/0015082 A1* | 1/2007 | Angelopoulos | G03F 7/0757 |
| | | | 430/270.1 |
| 2007/0032087 A1 | 2/2007 | Nishino | |
| 2007/0090090 A1* | 4/2007 | Nakaune | H01L 21/0332 |
| | | | 216/58 |
| 2007/0099390 A1* | 5/2007 | Lee et al. | 438/396 |
| 2007/0113881 A1* | 5/2007 | Mellott et al. | 136/243 |
| 2007/0182029 A1* | 8/2007 | Franosch et al. | 257/793 |
| 2007/0218679 A1* | 9/2007 | Schneider | H01L 21/31138 |
| | | | 438/638 |
| 2007/0247746 A1* | 10/2007 | Kim | G11B 5/11 |
| | | | 360/122 |
| 2008/0020570 A1* | 1/2008 | Naik | H01L 21/31116 |
| | | | 438/675 |
| 2008/0038922 A1* | 2/2008 | Lamers et al. | 438/694 |
| 2008/0044995 A1* | 2/2008 | Kang et al. | 438/597 |
| 2008/0105299 A1* | 5/2008 | Krasnov | H01L 31/022425 |
| | | | 136/256 |
| 2008/0115821 A1* | 5/2008 | Xu et al. | 136/244 |
| 2009/0042399 A1* | 2/2009 | Smith et al. | 438/735 |
| 2009/0047794 A1* | 2/2009 | Ogawa | H01L 21/31138 |
| | | | 438/725 |
| 2009/0142931 A1* | 6/2009 | Wang et al. | 438/734 |
| 2009/0197420 A1* | 8/2009 | Luong et al. | 438/713 |
| 2009/0197422 A1* | 8/2009 | Kang et al. | 438/717 |
| 2009/0218640 A1* | 9/2009 | Hampp | H01L 21/28518 |
| | | | 257/412 |
| 2010/0022091 A1* | 1/2010 | Li et al. | 438/706 |
| 2010/0052070 A1* | 3/2010 | Chung | H01L 29/66545 |
| | | | 257/369 |
| 2010/0178771 A1* | 7/2010 | Oh | H01L 21/31144 |
| | | | 438/700 |
| 2011/0076845 A1* | 3/2011 | Tsai | H01L 21/31144 |
| | | | 438/618 |
| 2011/0079918 A1* | 4/2011 | Zhou | G03F 7/427 |
| | | | 257/774 |
| 2011/0094416 A1* | 4/2011 | Kawai | B82Y 30/00 |
| | | | 106/287.1 |
| 2011/0101507 A1* | 5/2011 | Akinmade Yusuff et al. | 257/632 |
| 2011/0135557 A1* | 6/2011 | Rangarajan | C23C 16/30 |
| | | | 423/345 |
| 2012/0129337 A1* | 5/2012 | Chen et al. | 438/636 |
| 2012/0129338 A1* | 5/2012 | Kirimura | H01L 21/31116 |
| | | | 438/637 |
| 2012/0187420 A1* | 7/2012 | Li | H01L 21/28088 |
| | | | 257/77 |
| 2012/0200984 A1* | 8/2012 | Gros-Jean | C23C 16/405 |
| | | | 361/311 |
| 2012/0248609 A1* | 10/2012 | Tomita | 257/751 |
| 2012/0276747 A1* | 11/2012 | Oh et al. | 438/717 |
| 2012/0289043 A1* | 11/2012 | Hsieh | H01L 21/76804 |
| | | | 438/643 |
| 2012/0309199 A1* | 12/2012 | Liao et al. | 438/702 |
| 2012/0315748 A1* | 12/2012 | Chang et al. | 438/585 |
| 2013/0005151 A1* | 1/2013 | Chen et al. | 438/702 |
| 2013/0049144 A1* | 2/2013 | Tang | H01L 43/12 |
| | | | 257/421 |
| 2013/0285200 A1* | 10/2013 | Chang | H01L 23/642 |
| | | | 257/532 |
| 2014/0038412 A1* | 2/2014 | Hu et al. | 438/689 |
| 2014/0103455 A1* | 4/2014 | Ando | H01L 29/66795 |
| | | | 257/410 |
| 2014/0113438 A1* | 4/2014 | Usami | H01L 21/02592 |
| | | | 438/482 |
| 2014/0131770 A1* | 5/2014 | Chen | H01L 21/02381 |
| | | | 257/192 |
| 2014/0154852 A1* | 6/2014 | Chen et al. | 438/287 |
| 2014/0166094 A1* | 6/2014 | Loscutoff | H01L 31/18 |
| | | | 136/256 |
| 2014/0174518 A1* | 6/2014 | Wu | H01L 31/022425 |
| | | | 136/256 |
| 2014/0299474 A1* | 10/2014 | Walker | G01N 27/44704 |
| | | | 204/470 |
| 2014/0342486 A1* | 11/2014 | Basu | H01L 33/32 |
| | | | 438/47 |
| 2014/0342553 A1* | 11/2014 | Chen et al. | 438/666 |
| 2014/0346612 A1* | 11/2014 | Adam | H01L 21/76205 |
| | | | 257/397 |
| 2014/0349236 A1* | 11/2014 | Chen et al. | 430/311 |
| 2014/0349476 A1* | 11/2014 | Chen et al. | 438/620 |
| 2015/0194320 A1* | 7/2015 | Allen | H01L 21/31056 |
| | | | 438/699 |
| 2015/0287809 A1* | 10/2015 | Kerber | H01L 21/845 |
| | | | 438/479 |
| 2015/0303313 A1* | 10/2015 | Mallela | H01L 21/28291 |
| | | | 327/543 |
| 2016/0005831 A1* | 1/2016 | Ando | H01L 29/4966 |
| | | | 257/401 |

\* cited by examiner

METHOD OF PERFORMING ETCHING PROCESS

BACKGROUND OF THE INVENTION

1. Field of the Invention

The present invention relates to a method of performing an etching process, and more particularly, to a method of performing an etching process by using a tri-layer structure.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices.

Currently, in order to meet the shrinking size of the semiconductor MOS, more and more etching technologies are developed. For example, two-exposure-two-etching (2P2E) process or two-exposure-one-etching (2P1E) process are used in forming the contact or the metal interconnect system for connecting the MOS. However, because the small size of the semiconductor structure, there are some problems still need to overcome in current etching process.

SUMMARY OF THE INVENTION

The present invention therefore provides an etching process so as to obtain the desired accuracy of the products.

In one embodiment, a method of performing an etching process is provided. A substrate is provided wherein a first region and a second region are defined on the substrate, and an overlapping region of the first region and the second region is defined as a third region. A tri-layer structure comprising an organic layer, a bottom anti-reflection coating (BARC), and a photoresist layer is formed on the substrate. The photoresist layer and the BARC in the second region are removed. An etching process is performed to remove the organic layer in the second region by using the BARC and/or the photoresist layer as a mask, wherein the etching process uses an etchant comprises $CO_2$.

By using the etching process provided in the present invention, the layer with desired pattern can be obtained and the accuracy of the product can be upgraded.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 12 show schematic diagrams of the method of performing an etching process in the present invention, wherein FIG. 6 to FIG. 9 show a first embodiment and FIG. 10 and FIG. 11 show a second embodiment.

DETAILED DESCRIPTION

To provide a better understanding of the presented invention, preferred embodiments will be made in detail. The preferred embodiments of the present invention are illustrated in the accompanying drawings with numbered elements.

Figure 1:
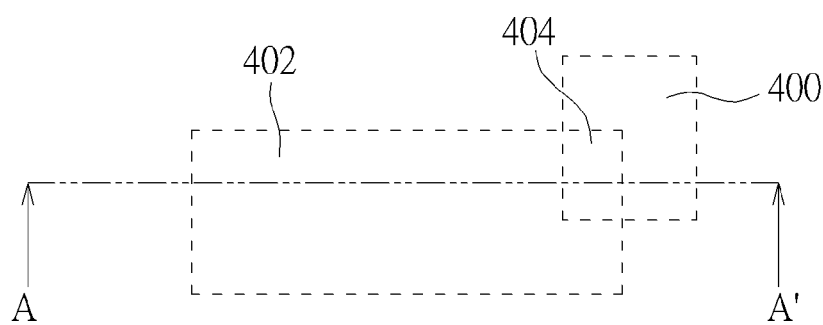
Figure 2:
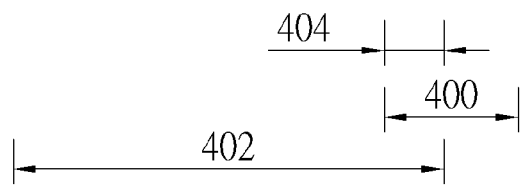
Figure 2:
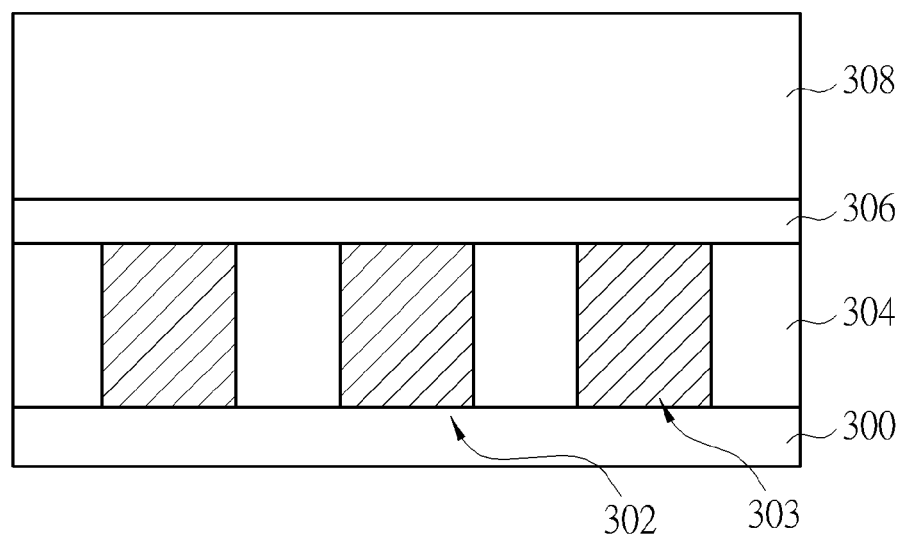

Please refer to FIG. 1 to FIG. 12, which illustrate schematic diagrams of the method of performing an etching process in the present invention wherein FIG. 2 is a cross sectional view taken along line AA' of FIG. 1. As shown in FIG. 1 and FIG. 2, a substrate 300 is provided. A first region 400 and a second region 402 are defined on the substrate 300, and a third region 404 is defined as the overlapping area of the first region 400 and the second region 402. The first region 400, the second region 402 and the third region 404 can be of any shapes, and in one embodiment both the first region 400 and the second region 402 have a stripe shape. In one embodiment, the substrate 300 can be a silicon substrate, an epitaxial silicon substrate, a silicon germanium substrate, a silicon carbide substrate or a silicon-on-insulator (SOI) substrate, but is not limited thereto. A first inter-layer dielectric (ILD) layer 304 is disposed on the substrate 300. A semiconductor structure 302, such as a transistor is formed on the substrate 300 and preferably disposed in the first ILD layer 304. In another embodiment, the semiconductor structure 302 can be disposed in other layers disposed between the first ILD layer 304 and the substrate 300. The semiconductor structure 302 has a contact 303, which is disposed in the first ILD layer 304, to provide an electrical path to connect the semiconductor structure 302 so an input/output signal can transfer into/out the semiconductor structure 302. For example, if the semiconductor structure 302 comprises a transistor, the contact 303 can be electrically connected to, for example, a source/drain region (not shown) of the transistor. It is understood that the semiconductor structure 302 can be other semiconductor structures with a contact 303 for an interconnection system to electrically connect with. For example, the semiconductor structure 302 can be a capacitor, a through-silicon-via (TSV) or a metal interconnection system. In another embodiment, there may be one or more than layers disposed between the substrate 300 and the contact 303. In the present invention, a part of the contact 303 is disposed in the third region 404, and at least a part of the contact 303 overlaps the third region 404, so the interconnect system (not shown) formed in the third region 404 in the subsequent steps can be to electrically connect the contact 303.

As shown in FIG. 2, after forming the semiconductor structure 302 and the contact 303, a second ILD layer 306 is disposed on the first ILD layer 304, wherein the second ILD layer 306 directly contacts the contact 303. Next, a third ILD layer 308 is formed on the second ILD layer 306. In one preferred embodiment, the second ILD layer 306 has an etching selectivity with respect to that of the third ILD layer 308. That is, under the same etching process, the etching rate of the second ILD layer 306 is greatly different from that of the third ILD layer 308. In one preferred embodiment of the present invention, the second ILD layer 306 is, for example, a nitrogen-containing layer or a carbon-containing layer, such as SiN, SiC or SiCN, and the third ILD layer 308 contains $SiO_2$. In one embodiment, the third ILD layer 308 can contain one or more than one dielectric layers, which may be formed by a chemical vapor deposition (CVD) process, a spin coating process, or other suitable process that can form any dielectric materials.

Figure 3:
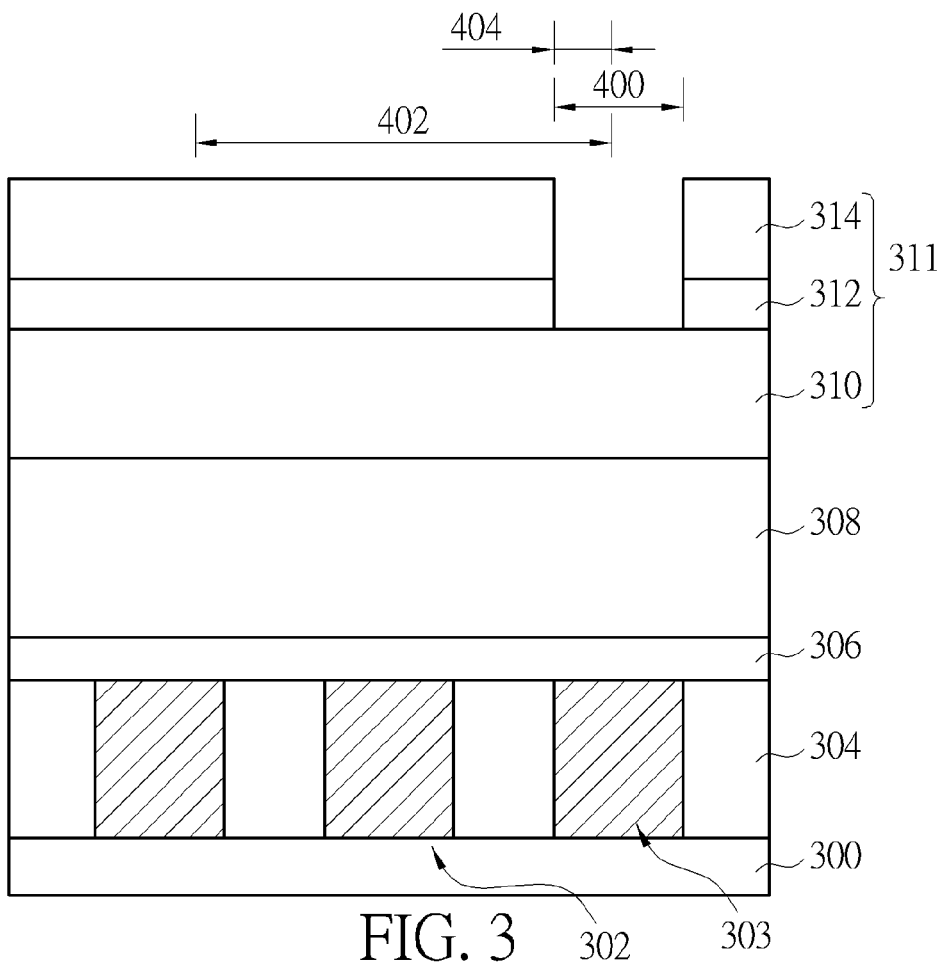

As shown in FIG. 3, a first tri-layer structure 311 is formed on the third ILD layer 308. In one embodiment, the first tri-layer structure 311 contains a first photoresist layer 314, a first bottom anti-reflection coating (BARC) layer 312 and a first organic layer 310, from top to bottom. The first BARC layer 312 is disposed directly under the first photoresist layer 314 to serve as a BARC and a mask layer, and the first organic layer 310 is an organic underlayer, i.e., a hydrocarbon, which is used to serves as a final mask layer. In one embodiment, the first photoresist layer 314 is a photoresist material suitable for light source having a wavelength of 193 nm. The first BARC layer 312 contains silicon, such as a silicon-containing hardmask bottom anti-reflection coating (SHB). The first organic layer 310 contains photo-resistive material or organic dielectric material (ODL) provided by Shin-Etsu Chemical Co. Ltd. Preferably, the first organic layer 310 has an etching selectivity with respect to the third ILD layer 308. In one embodiment, the first photoresist layer 314 is about 500 angstroms to 900 angstroms, the first BARC layer 312 is about 300 angstroms to 800 angstroms, and the first organic layer 310 is about 1500 angstroms to 2500 angstroms. Next, a photo-etching-process (PEP) is performed to remove the first BARC layer 312 and the first photoresist layer 314 in the first region 400. Alternatively, the patterned first photoresist layer 314 is removed away, but in another embodiment, the first photoresist layer 314 can be remained.

Figure 4:
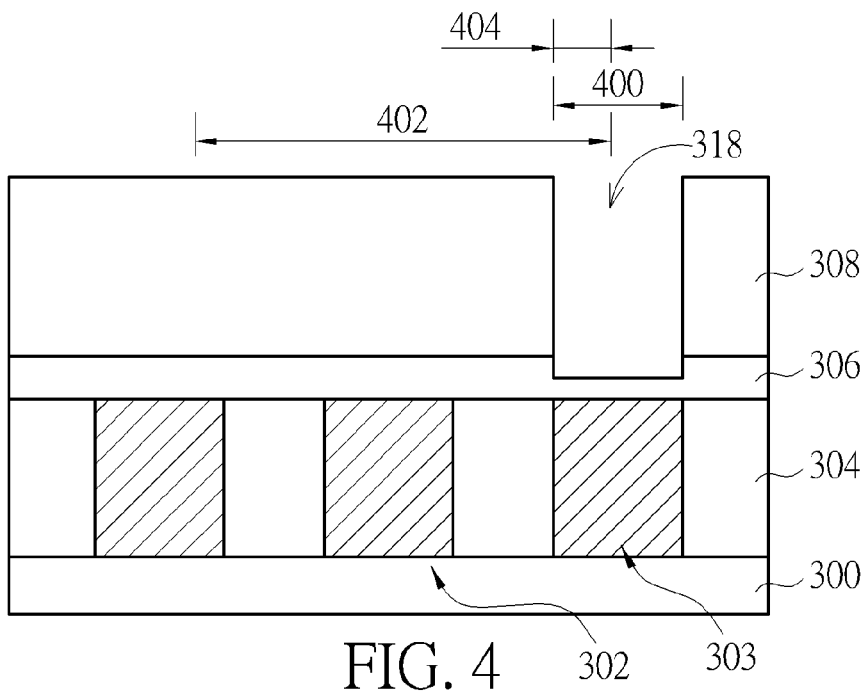

Then, a first etching process is performed to remove the first organic layer 310 in the first region 400 by using the patterned first BARC 312 and/or the first photoresist layer 314 as a mask. Then, another etching process is carried out by using the patterned first organic layer 310 as a mask, forming a first opening 318 in the third ILD layer 308 in the first region 400, as shown in FIG. 4. In one embodiment, a part of the second ILD layer 306 in the first region 400 is removed away, but the contact 303 is not exposed. Next, the first organic layer 310 and the first BARC layer 312 are removed away.

Figure 5:
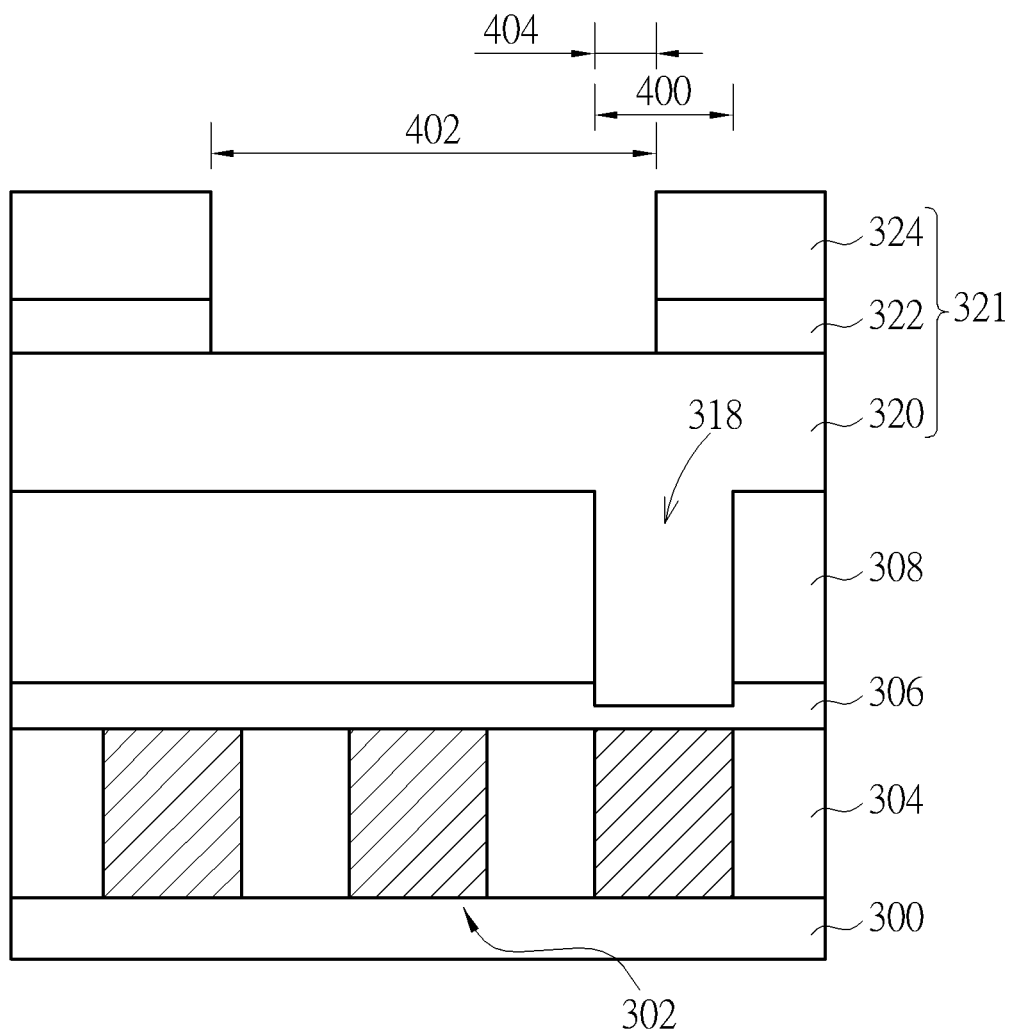

As shown in FIG. 5, a second tri-layer structure 321 is formed on the third ILD layer 308. In one embodiment, the second tri-layer structure 321 contains a second photoresist layer 324, a second BARC layer 322 and a second organic layer 320, from top to bottom. The detailed embodiment of the second tri-layer structure 321 is similar with that of the first tri-layer structure 311, and is not described repeatedly. As shown in FIG. 5, the first opening 318 in the third ILD layer 308 is completely filled with the second organic layer 320. Next, a PEP is performed to remove the second photoresist layer 324 and the second BARC layer 322 in the second region 402, as shown in FIG. 5. Alternatively, the patterned second photoresist layer 324 is removed away, but in another embodiment, the second photoresist layer 324 can be remained.

Figure 6:
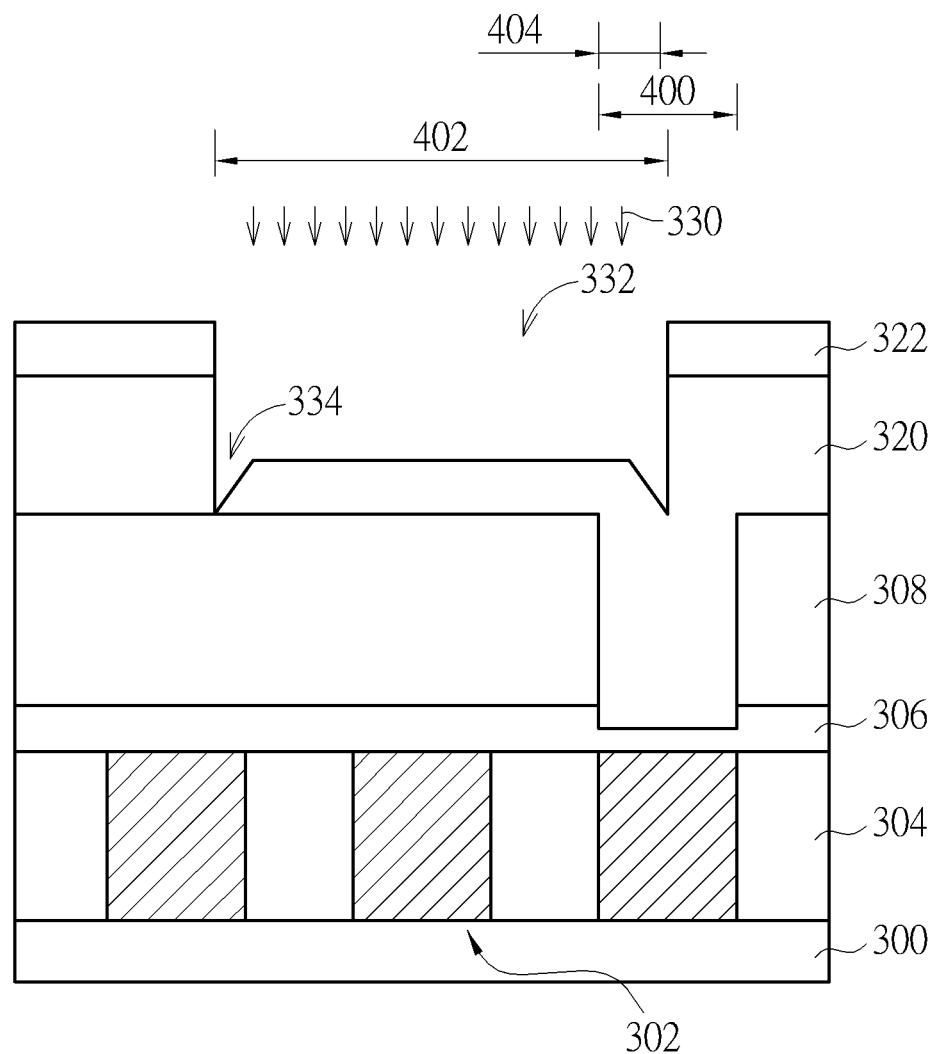
Figure 7:
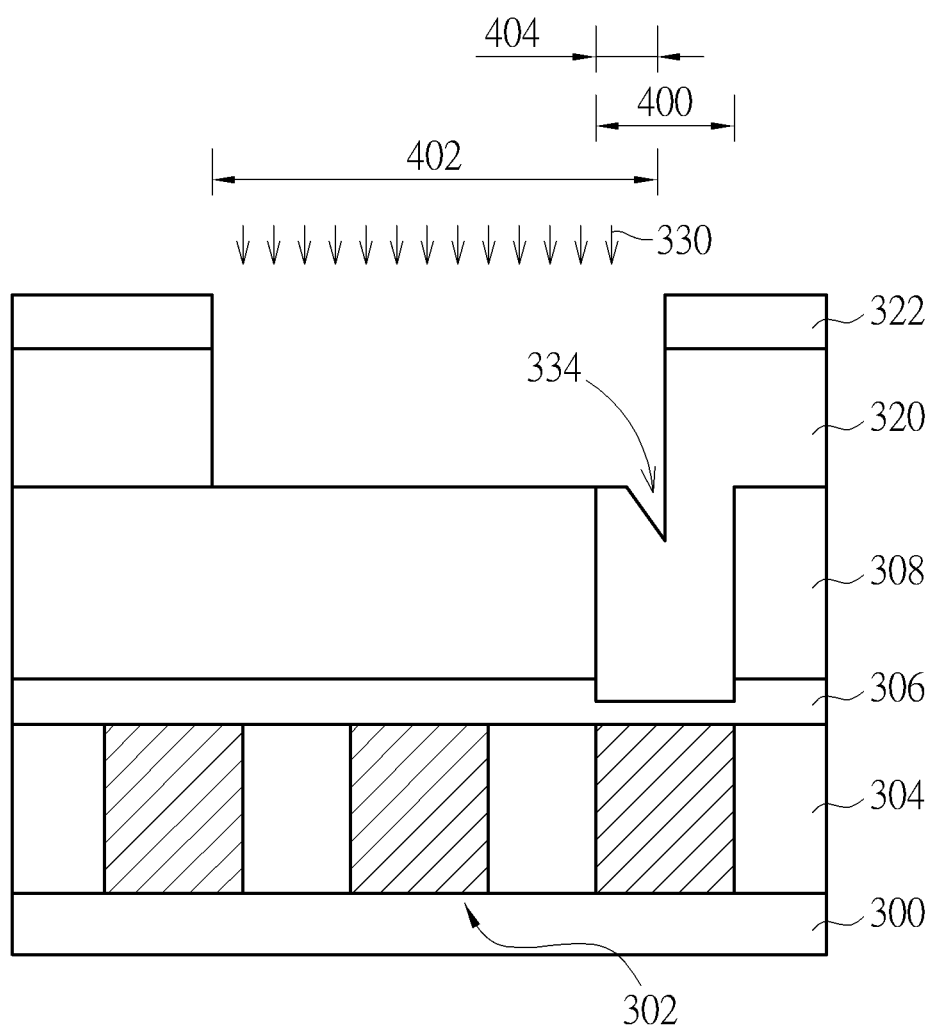
Figure 8:
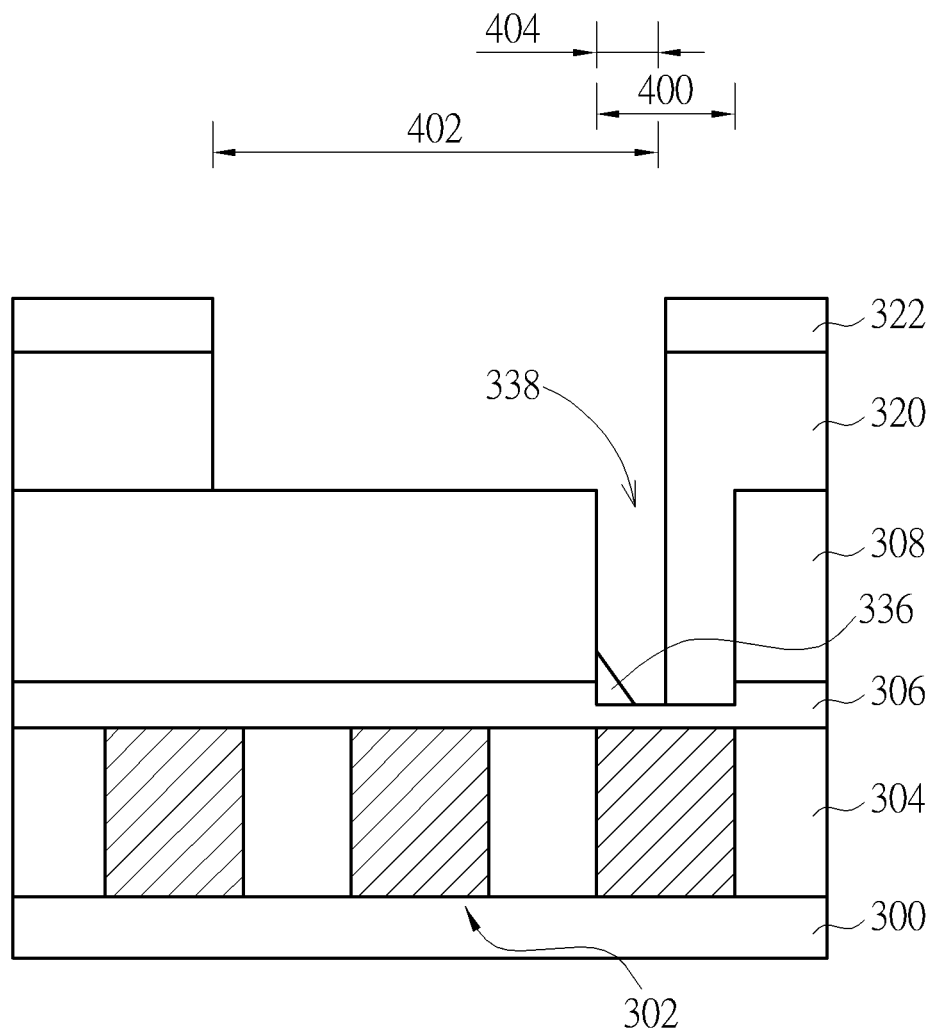
Figure 9:
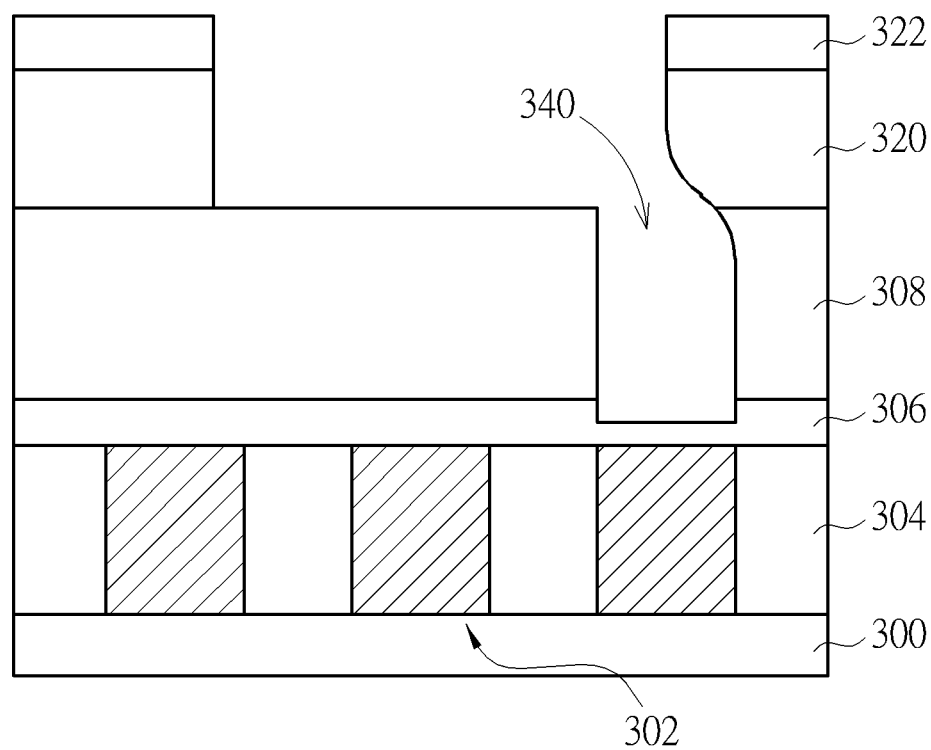

Next, as shown in FIG. 6 to FIG. 9, a second etching process 330 is performed to remove the second organic layer 320 in the second region 402 by using the patterned second SHB 322 and/or the second photoresist layer 324 as a mask. In this embodiment, the second etching process 330 uses an etchant containing $N_2H_2$. As shown in FIG. 6, the second etching process 330 removes the second organic layer 320 above a top surface of the third ILD layer 308, and a first trench 332 is formed in the second organic layer 320 above the third ILD layer 308. In this step, a part of the second organic layer 320 near the center of the first trench 332 is not removed and a part of the second organic layer 320 at the peripheral is removed away, so a micro trench 334 is formed near the border of the second region 402. Next, as shown in FIG. 7, the second etching process 330 is still performed to remove the second organic layer 320 remained at the center of the first trench 332, but the micro trench 334 structure is formed conformally near the border of the second region 402. As shown in FIG. 8, the second etching process 330 is continued to remove the second organic layer 320 in the first opening 318 to expose the second ILD layer 306. A second trench 338 is formed in the third ILD layer 308 within the third region 404. However, the micro trench 334 is still remained in the second trench 338 and a redundant portion 336 of the second organic layer 320 is formed under the second trench 338. As shown in FIG. 9, in order to remove the redundant portion 336, the second etching process 330 is still performed, and a third trench 340, which is formed by enlarging the second trench 338 is formed. The third trench 340 exceeds the third region 404.

Figure 10:
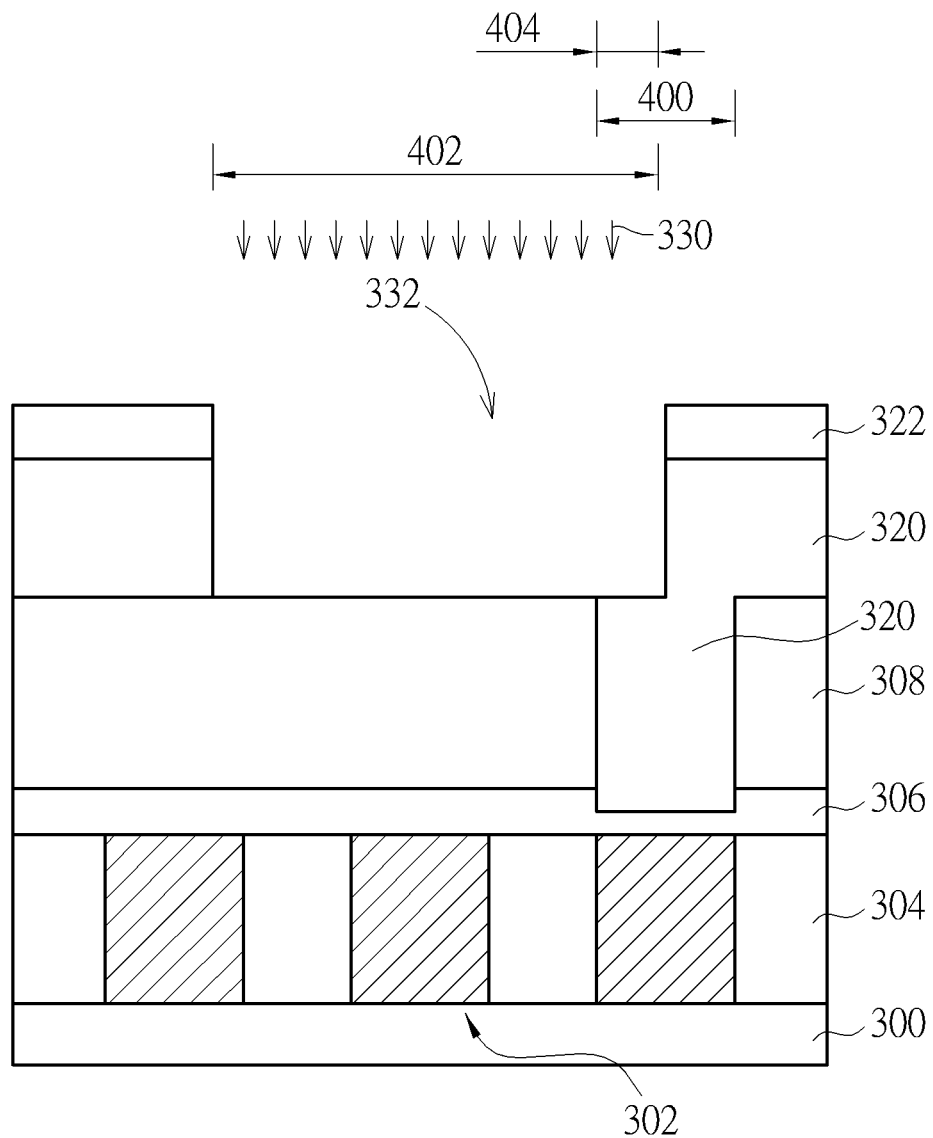
Figure 11:
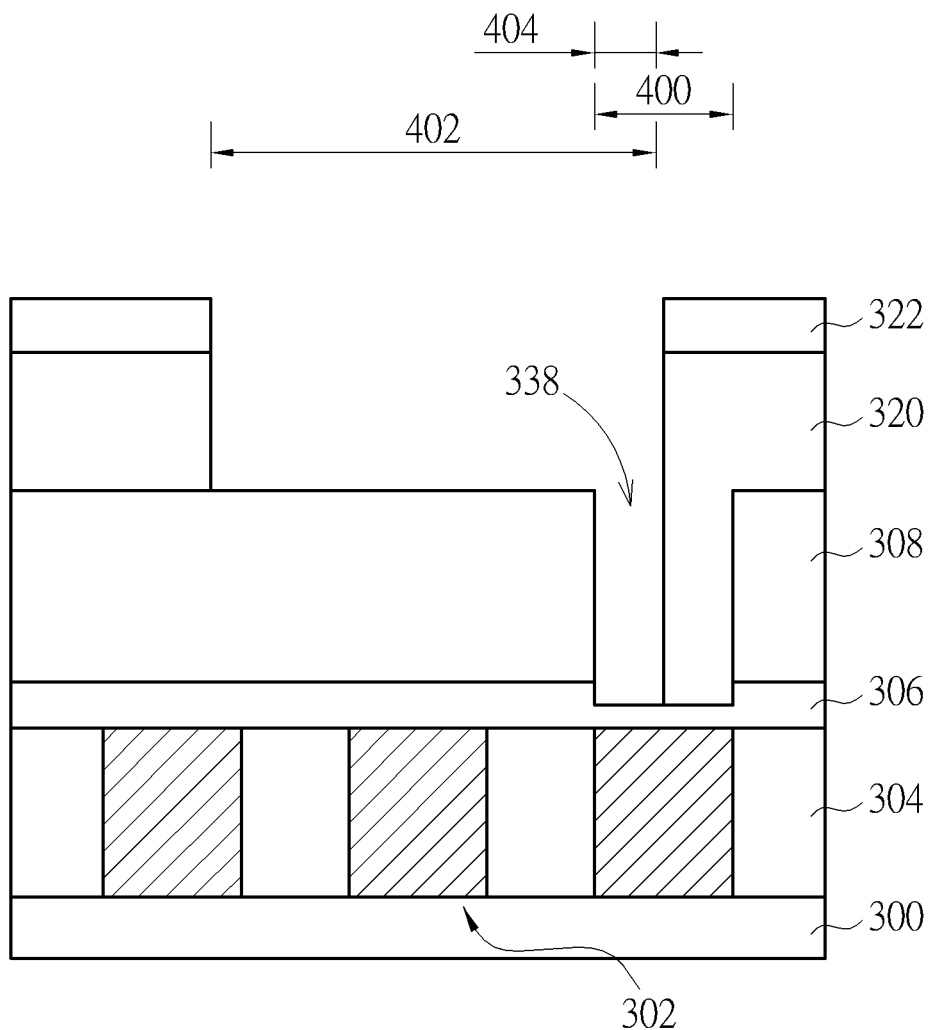

In the previous embodiment, an enlarged second trench 338 (that is, the third trench 340) is easy to form. In order not to form the enlarged second trench 338, another embodiment of the second etching process 330 is provided. After performing the step in FIG. 1 to FIG. 5, as shown in FIG. 10 and FIG. 11, the second etching process 330 is performed. In this embodiment, the second etching process 330 for etching the second organic layer 320 uses $CO_2$ as an etchant. In one embodiment, besides $CO_2$, the etchant of the second etching process 330 contains $N_2H_2$. In one preferred embodiment, the etchant of the second etching process 330 does not contain $N_2H_2$. In further embodiment, the etchant consists of $CO_2$. As shown in FIG. 10, when using $CO_2$ as an etchant, no micro trench structure is formed in the first trench 330, and the first trench 330 with a flat bottom surface can be formed. As shown in FIG. 11, no redundant portion 336 is formed in the second trench 338. As a result, the second trench 338 in this embodiment requires no enlarging step, and the second trench 338 can perfectly coincide with the third region 404.

Figure 12:
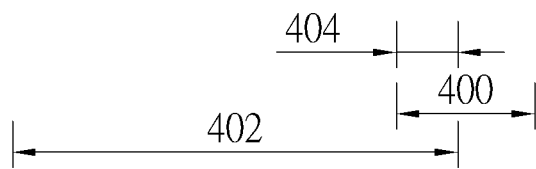
Figure 12:
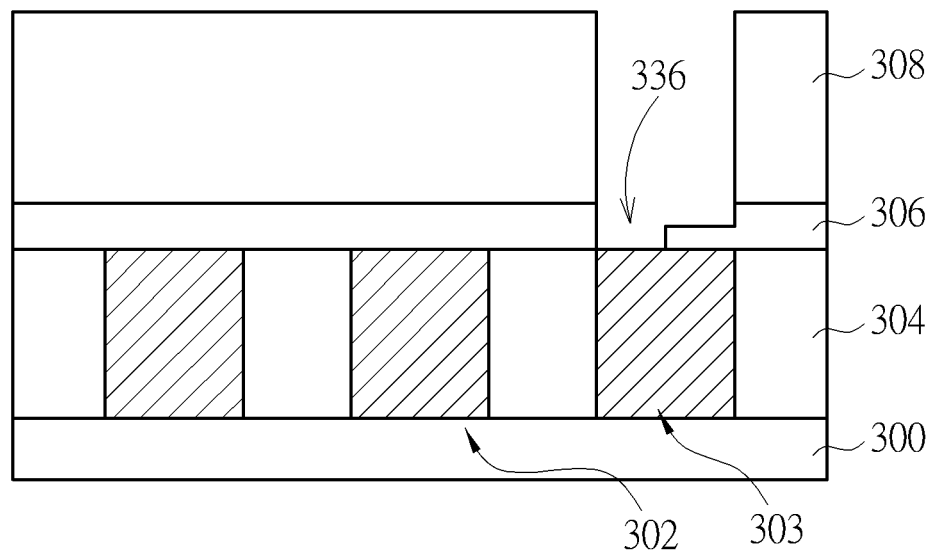

Next, as shown in FIG. 12, another etching process is performed by using the second organic layer 320 as a mask, thereby removing the second ILD layer 306 only in the third region 404 to expose the contact 303. Next, the second organic layer 320 and the second BARC 322 are removed away. Therefore, a fourth opening 336 exposing the contact 303 only in the third region 404 is therefore obtained in the second ILD layer 306. A plurality of processes for forming an electrical contact (not shown) through the fourth opening 336 can be carried out in the subsequent steps. For example, the electrical contact can include a barrier layer made of TiN or TaN and a conductive layer made of copper or tungsten. The step of forming the electrical contact is well-known in the art and is not repeated. Thereafter, the semiconductor structure 302 can receive outside signal through the contact 303 and the electrical contact (not shown) in the fourth opening 336.

In summary, the present invention provides two embodiments for performing the second etching process in order to etch the second organic layer. In the first embodiment, an etching containing $N_2H_2$ is used and an enlarged second trench is formed. In the second embodiment, an etchant containing $CO_2$ is used and a second trench coinciding with the third region can be formed. It is noted that the etchant provided in the present invention can be applied in any photo-etching process containing organic layer. For example, in the present invention, the first etching process in FIG. 4 can also use $CO_2$ as an etchant to remove the first organic layer. By using the etching process provided in the present invention, especially the second embodiment, the layer with desired pattern can be obtained and the accuracy of the product can be upgraded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of performing an etching process, comprising:
   providing a substrate, wherein a first region and a second region are defined on the substrate, and an overlapping region of the first region and the second region is defined as a third region, and the third region is not equal to the first region or the second region;

forming a dielectric layer having a first trench in the first region, wherein the dielectric layer comprises a first dielectric layer and a second dielectric layer, the first trench penetrates the first dielectric layer and does not penetrate the second dielectric layer;

forming a tri-layer structure comprising an organic layer, a bottom anti-reflection coating (BARC) layer, and a photoresist layer sequentially on the substrate;

removing the photoresist layer and the BARC in the second region; and performing an etching process to remove the organic layer in the second region by using the BARC layer and/or the photoresist layer as a mask, wherein the etching process uses an etchant comprises $CO_2$, and the organic layer in the third region is completely removed and the organic layer in the first region is partially removed;

after the etching process, performing a second etching process to only remove the second dielectric layer in the third region to expose a contact of a semiconductor structure under the second dielectric layer.

2. The method of performing an etching process according to claim 1, wherein the organic layer comprises photoresist material or organic dielectric layer (ODL).

3. The method of performing an etching process according to claim 1, wherein the BARC layer contains silicon.

4. The method of performing an etching process according to claim 1, wherein the etchant consist of $CO_2$.

5. The method of performing an etching process according to claim 1, wherein the etchant does not include $N_2H_2$.

6. The method of performing an etching process according to claim 1, wherein the tri-layer structure is formed directly on the dielectric layer having the first trench in the first region.

7. The method of performing an etching process according to claim 6, wherein the first trench is filled with the organic layer.

8. The method of performing an etching process according to claim 1, wherein after the second etching process, an opening disposed only in the third region is formed in the second dielectric layer.

9. The method of performing an etching process according to claim 1, wherein the semiconductor structure comprises a transistor, a capacitor, a through-silicon-via (TSV) or a metal interconnection system.

10. The method of performing an etching process according to claim 1, wherein the organic layer has an etching selectivity with respect to the dielectric layer.

* * * * *